(12) United States Patent
Batruni (10) Patent No.: US 7,358,798 B1
(45) Date of Patent: Apr. 15, 2008

(54) NONLINEAR FILTER

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 0 days.

(21) Appl. No.: 11/036,662

(22) Filed: Jan. 14, 2005

Related U.S. Application Data (63) Continuation of application No. 10/372,638, filed on Feb. 21, 2003, now Pat. No. 6,856,191.

(51) Int. Cl.
*H03K 5/00* (2006.01)

(52) U.S. Cl. ...................................... 327/552; 708/322

(58) Field of Classification Search ........ 327/552–559; 708/322, 323; 375/232, 305, 14
See application file for complete search history.

(56) References Cited

U.S. PATENT DOCUMENTS

| | | | | |
|---|---|---|---|---|
| 4,435,823 A | * | 3/1984 | Davis et al. ................. | 375/232 |
| 4,563,681 A | * | 1/1986 | Godard .................. | 340/825.71 |
| 4,843,583 A | | 6/1989 | White et al. | |
| 4,905,101 A | * | 2/1990 | Ohta et al. ..................... | 386/90 |
| 4,954,732 A | * | 9/1990 | Surauer et al. ............. | 327/552 |
| 5,302,909 A | | 4/1994 | Kettenis et al. | |
| 5,388,080 A | * | 2/1995 | Feintuch et al. ............. | 367/135 |
| 5,535,246 A | | 7/1996 | Beech | |
| 5,683,425 A | * | 11/1997 | Hauptmann .................... | 607/9 |
| 5,685,317 A | * | 11/1997 | Sjostrom .................... | 600/528 |
| 6,181,754 B1 | | 1/2001 | Chen | |
| 6,351,740 B1 | | 2/2002 | Rabinowitz | |
| 6,738,482 B1 | * | 5/2004 | Jaber ......................... | 381/94.7 |

OTHER PUBLICATIONS

Frank, Walter A., "An Efficient Approximation to the Quadratic Volterra Filter and Its Application I Realtime Loudspeaker Linearization", Universitat der Bundeswehr Munchen, D85577 Neubiberg Germany.
Frank, Walter A., "On the Equalization of Nonlinear Systems", Universitat der Bundeswehr Munchen, Neubiberg, Germany.
Giannakis, Georgios B., "Blind Fractionally Spaced Equalization of Noisy FIR Channels: Direct and Adaptive Solutions", IEEE Transactions on Signal Processing, vol. 45, No. 9, Sep. 1997.
Griffith, David W., Jr. et al, "Partially Decoupled Volterra Filters: Formulation and LMS Adaptation" Dept. of Electrical Engineering, University of Delaware, Newark, Delaware.

(Continued)

*Primary Examiner*—Dinh T. Le
(74) *Attorney, Agent, or Firm*—Van Pelt, Yi & James LLP (57) ABSTRACT

A system and a method are disclosed for converting analog signal to digital. An analog to digital converter system comprises an analog to digital converter (ADC) and an adaptive filter coupled to the ADC, wherein the adaptive filter is coupled to the ADC in a feedforward configuration. A method of generating a digital signal based on an analog signal comprises applying the analog signal to an analog to digital converter (ADC) to generate an ADC output and sending the ADC output to an adaptive filter, wherein the adaptive filter is coupled to the ADC in a feedforward configuration.

20 Claims, 12 Drawing Sheets

OTHER PUBLICATIONS

Schulz-Mirbach, Hanns, "Nonlinear Model-Based Analysis and Description of Images for Multimedia Applications", Internal Report Jul. 1996, TU Hamburg-Harburg, Technische Informatik I, Oct. 1996.

P.L Feintusch, An Adaptive Recursive LMS Filter, Proceedings from the IEEE, vol. 64, No. 11, Nov. 1976, pp. 1622-1624.

Frank, Walter A., "An Efficient Approximation to the Quadratic Volterra Filter and Its Application I Realtime Loudspeaker Linearization", Universitat der Bundeswehr Munchen, D85577 Neubiberg Germany, no date.

Frank, Walter A., "On the Equalization of Nonlinear Systems", Universitat der Bundeswehr Munchen, Neubiberg, Germany, no date.

Griffith, David W., Jr. et al, "Partially Decoupled Volterra Filters: Formulation and LMS Adaptation" Dept. of Electrical Engineering, University of Delaware, Newark, Delaware, no date.

* cited by examiner

NONLINEAR FILTER

CROSS REFERENCE TO OTHER APPLICATIONS

This application is a continuation of U.S. patent application Ser. No. 10/372,638, entitled NONLINEAR FILTER filed Feb. 21, 2003 now U.S. Pat. No. 6,856,191, which is incorporated herein by reference for all purposes.

FIELD OF THE INVENTION

The present invention relates generally to nonlinear filters. More specifically, a nonlinear filter synthesized from a combination of linear filters and nonlinear elements is disclosed.

BACKGROUND OF THE INVENTION

Digital signal processing (DSP) software and hardware are widely used in many systems, ranging from low-cost consumer electronics to sophisticated communications products. In many systems, an analog signal received through a channel is input to an analog to digital converter (ADC), which converts the signal to digital. The digital signal is then further processed by the DSP components.

Ideally, every portion of the signal path, including the signal source, the receiver's analog front-end, the ADC, should be linear, thus allowing traditional linear signal processing techniques to be used to correct for any linear distortion that corrupts the received signal. In practice, however, most systems are nonlinear. There are many sources that introduce nonlinearity to the signal path, including the transmitter/receiver electronics and the channel medium. A major source of the nonlinearity is the ADC. Component mismatches, quantization errors, and limited bandwidth of amplifiers are some of the factors contributing to the nonlinearities.

It would be desirable to improve system performance by reducing the nonlinearities. However, there has been limited success in using conventional filtering techniques to equalize the nonlinearities. Since nonlinear transfer functions are often expressed as higher order polynomials, it is difficult to model these nonlinear functions and to design filters accordingly. The complexity of nonlinear filters often introduces instability and convergence problems to the system. It would be desirable to have a way to model the nonlinearities effectively. It would also be useful to be able to adjust a nonlinear model without introducing instabilities.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways including, as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved nonlinear filter is disclosed. The transfer function of the nonlinear filter is an approximation of an original, nonlinear transfer function. In one embodiment, the nonlinear filter includes a plurality of linear filters connected to nonlinear elements to produce nonlinear outputs. A combination network combines the nonlinear outputs to achieve the desired nonlinear transfer function. In some embodiments, the nonlinear elements are absolute value operators. In some embodiments, the combination network includes a summation network. In some embodiments, the combination network includes a min-max selection network. The filter can be adaptively trained to model nonlinear systems, and is particularly useful in one embodiment used in an ADC for error reduction.

Figure 1A:
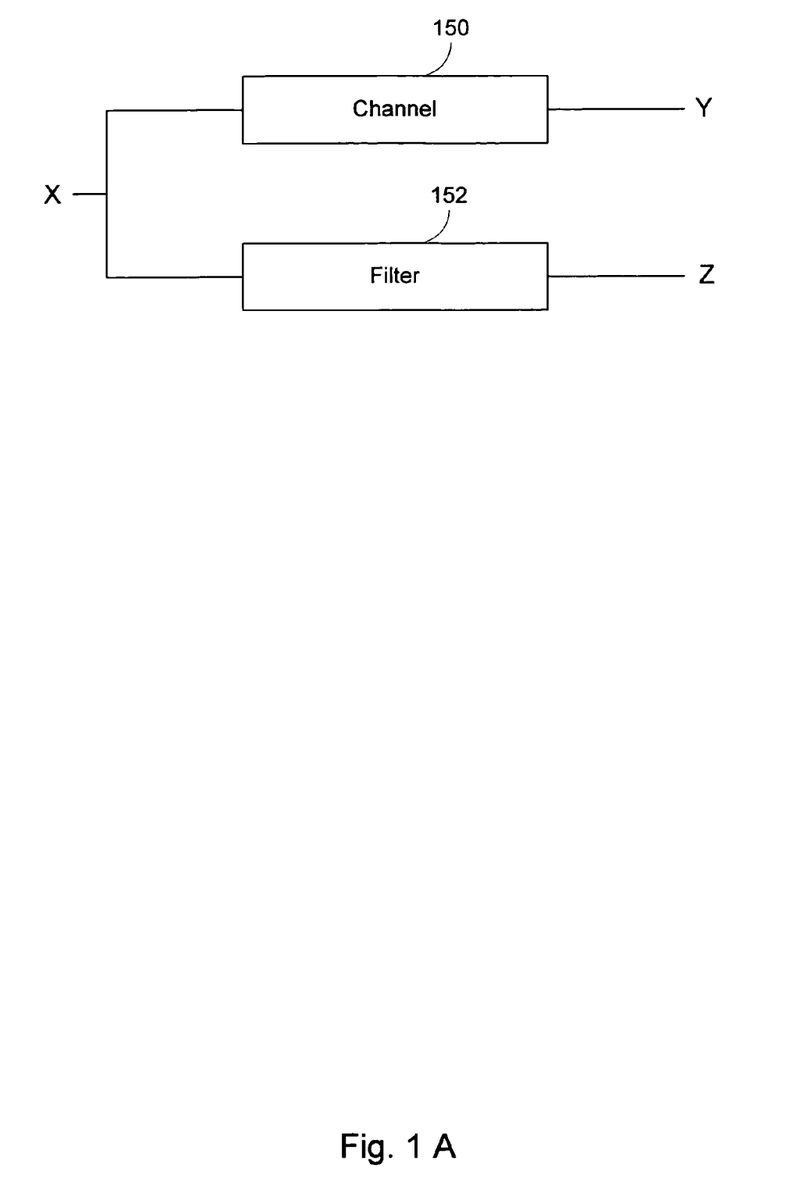
FIG. 1A is a block diagram illustrating the modeling of a channel.

FIG. 1A is a block diagram illustrating the modeling of a channel. An input, X, is sent to a channel represented by block 150, and a filter 152 that models the characteristics of the channel. Y and Z are the outputs of the channel and the filter, respectively. If the transfer characteristics of the filter are sufficiently close to the transfer characteristics of the channel, then Y and Z are approximately the same. Channel modeling is useful for a variety of purposes, such as distortion cancellation and equalizer design. While it is relatively straightforward to model linear channels, it is often much more difficult to model nonlinear channels since the channel characteristics are often expressed as higher order nonlinear polynomials.

The difficulties in solving higher order, nonlinear polynomials for nonlinear filter design are widely acknowledged. Instead of attempting to solve nonlinear polynomials, the present invention approximates the nonlinear functions with functions that are first order polynomials. The approximation is used to design filters comprised of linear filters. The parameters of the linear filters are derived from the linear functions.

Figure 1B:
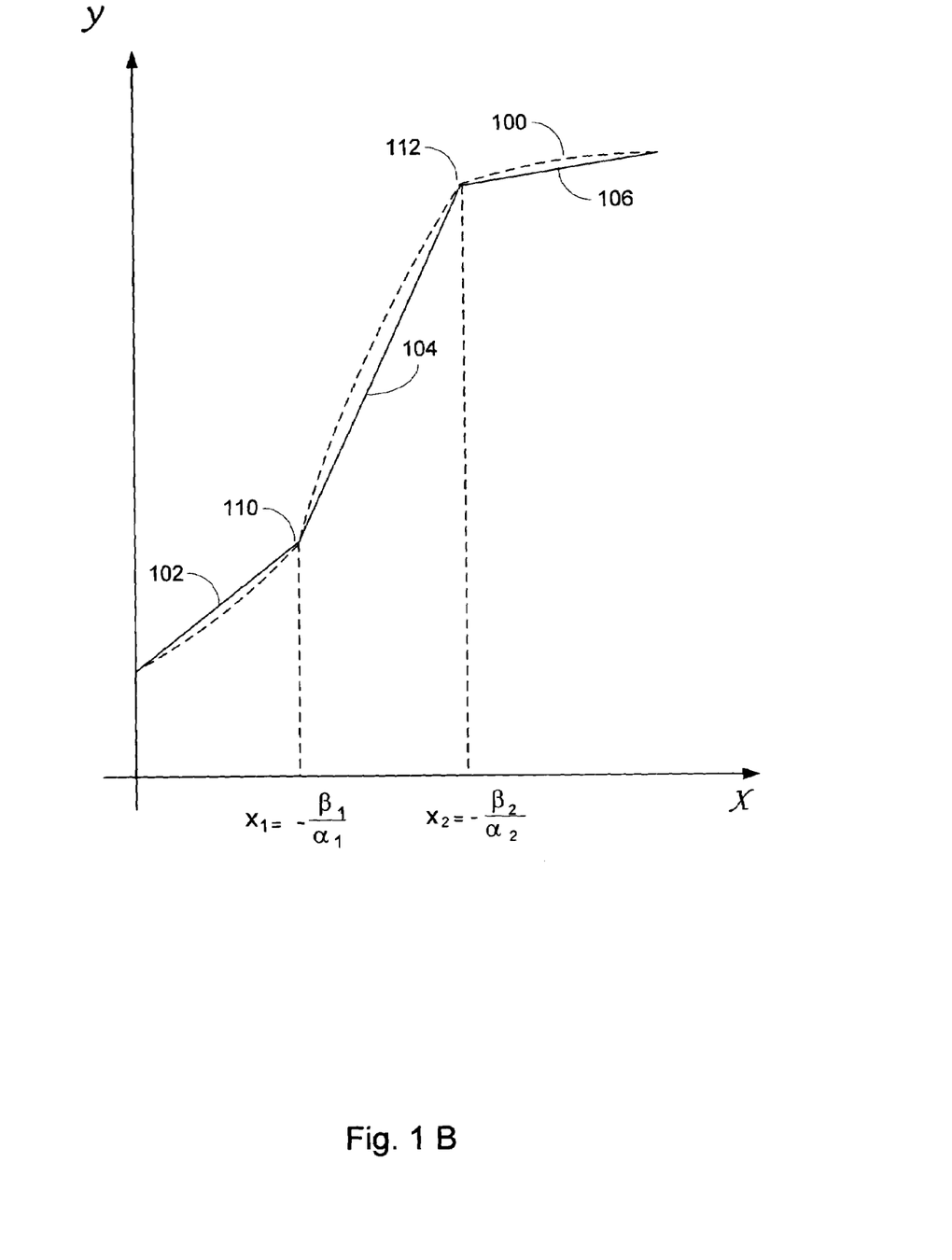
FIG. 1B is a chart illustrating one approach to the modeling of a nonlinear function according to present invention.

FIG. 1B is a chart illustrating one approach to the approximation of a nonlinear function according to present invention. A nonlinear function 100 (shown as a dashed line) is approximated by linear segments 102, 104, and 106. The linear segments are derived using techniques such as least mean square fit. The resulting approximation function is:

$$y = a \cdot x + b_0 + c_1 \cdot |\alpha_1 \cdot x + \beta_1| + c_2|\alpha_2 \cdot x + \beta_2|.$$  (Equation 1)

This function can be implemented using linear filters and nonlinear elements. The parameters of the linear filters are determined by the parameters in the function. It should be noted that the approximation function remains nonlinear due to the absolute value operations. Break points 110, and 112 are locations where the slopes of the segments change, and they correspond to x values of $-\beta_1/\alpha_1$ and $-\beta_2/\alpha_2$, respectively. The difference between the slope of segments 102 and the slope of 104 is $2c_1\alpha_1$; and the slope difference between segments 104 and 106 is $2c_2\alpha_2$.

The approximation method can be generalized to model nonlinear functions. Since the resulting approximation function is comprised of linear segments that are first order polynomials, it is less complex than the original nonlinear function that is comprised of higher order polynomials, and the corresponding filter implementation is more straightforward. It is now possible to use linear filters to implement a nonlinear filter whose transfer function approximates the original, more complex nonlinear transfer function.

It is also advantageous that the first order polynomials in the linearized function are easier to compute and manipulate than the higher order polynomials in the original nonlinear function. The simplified approximation function makes it possible to adjust the filter design to make tradeoffs yet still keep the system stable. For example, the zeroes of a linearized function may be shifted to achieve better response time, and the poles may be adjusted to stay within the desired regions to ensure system stability. It would be more difficult to make such adjustments to a higher order nonlinear system since the poles and zeros of higher order polynomials tend to be less well behaved.

Figure 2A:
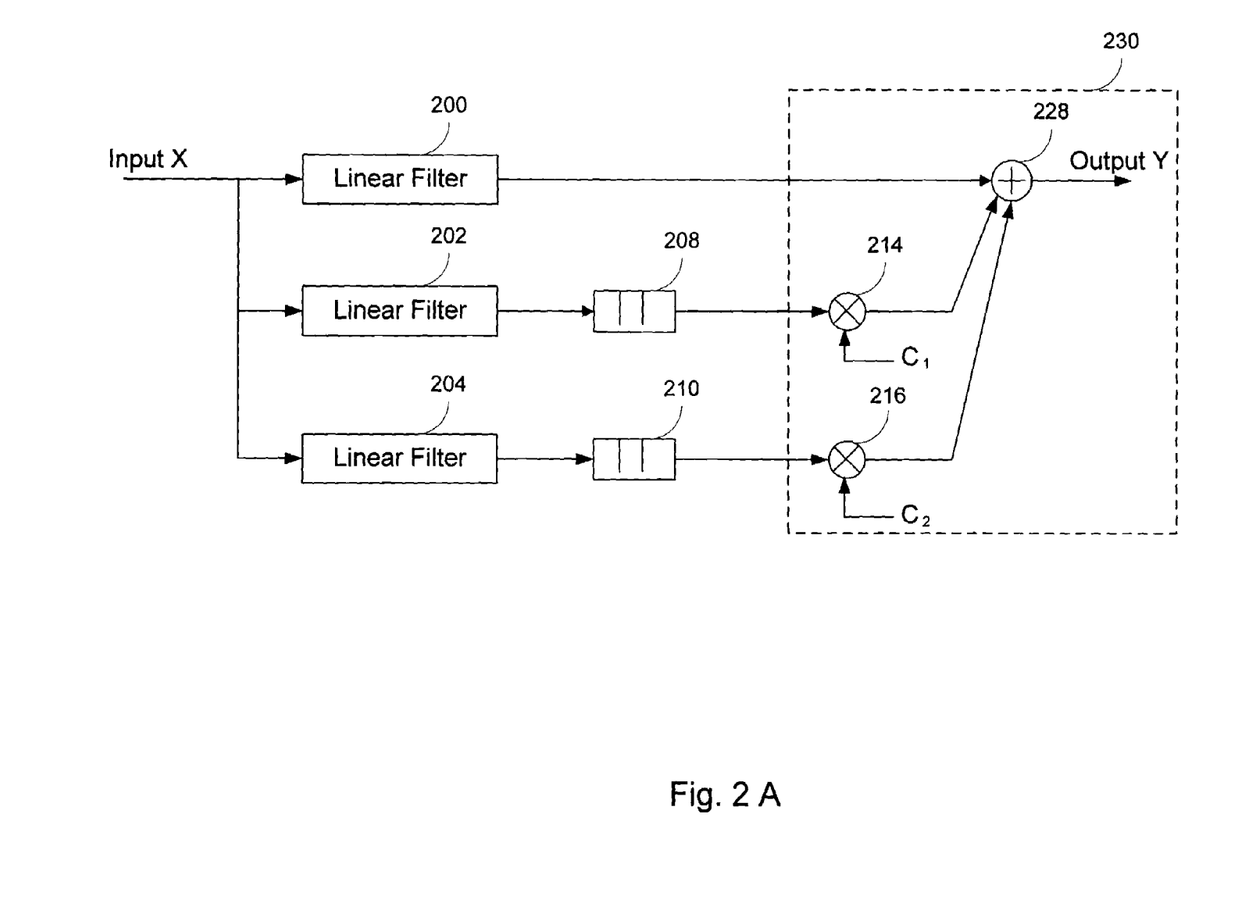
FIGS. 2A-2B are block diagrams illustrating a linear filter based nonlinear filter implementation according to one embodiment of the present invention.
Figure 2B:
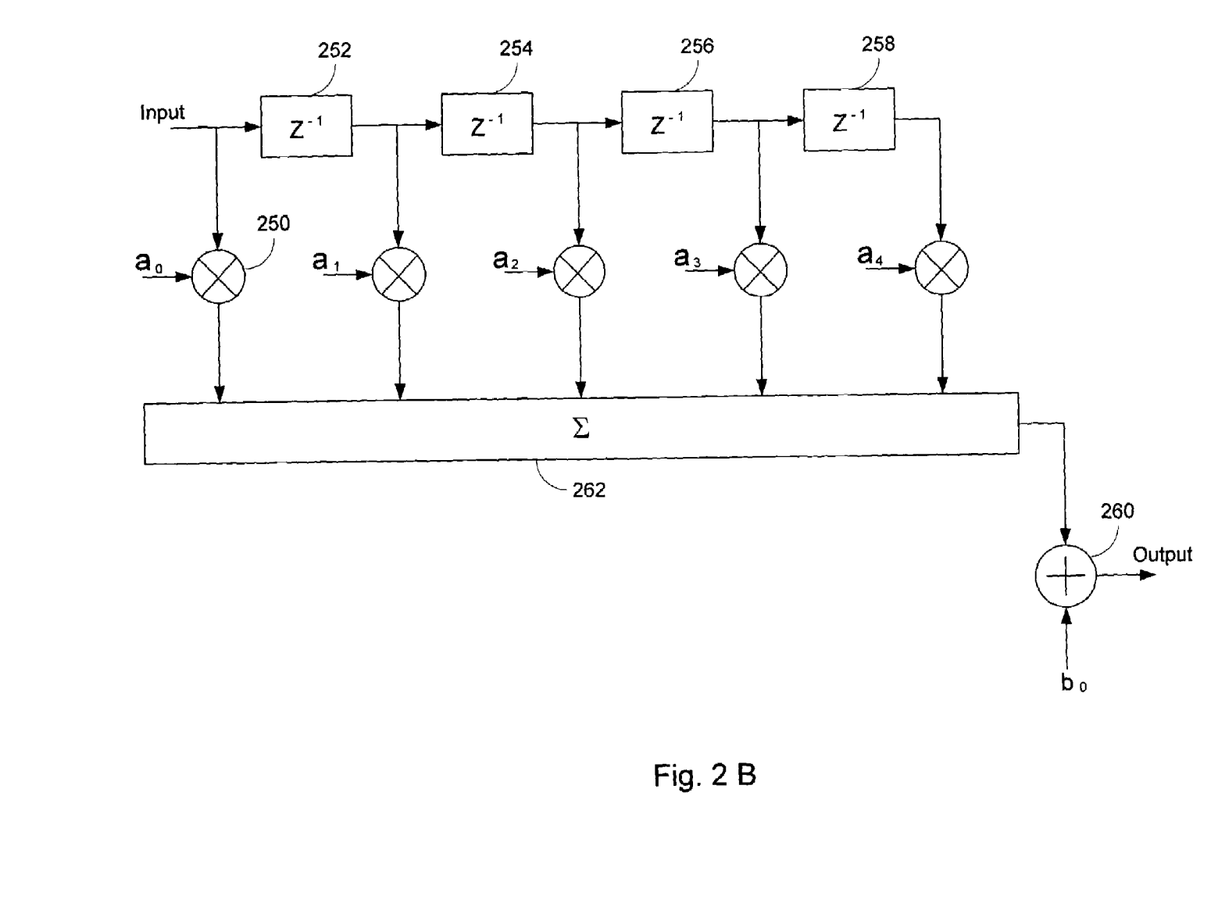

FIGS. 2A-2B are block diagrams illustrating a linear filter based nonlinear filter implementation according to one embodiment of the present invention. FIG. 2A illustrates the overall architecture of the nonlinear filter. The input vector X is sent to linear filters 200, 202, and 204. The outputs of filters 202 and 204 are sent to nonlinear elements 208 and 210, respectively. A nonlinear element may be a discrete component, a part of an integrated circuit chip, a processor, or any other appropriate hardware and/or software for providing a nonlinear transformation to an input. In this embodiment, each of the nonlinear elements is an absolute value operator that applies an absolute value function to its input.

The outputs of the nonlinear elements and the output of filter 200 are combined by a combination network 230 to produce the desired transfer function. In this embodiment, the combination network is a summation network comprised of multipliers 214 and 216, and combiner 228. The outputs of nonlinear elements 208 and 210 are scaled by factors of C1 and C2, via multipliers 214 and 216, respectively. The scaled nonlinear outputs and the output from filter 200 are summed by combiner 228 to produce an output having a transfer function similar to Equation 1.

FIG. 2B illustrates the details of linear filter 200 shown in FIG. 2A. The input is scaled by a factor $a_0$ using a multiplier 250. The input is also sent to a plurality of delay stages 252, 254, 256 and 258. The delayed signals are scaled by factors of a1, a2, a3 and a4. The scaled signals are combined by a combiner 262. A constant value $b_0$ is added to the combined result via another combiner 260 to generate the output. The output of filter 200 provides an averaging effect to the overall nonlinear filter (similar to the term $a \cdot x + b_0$ in equation 1,) thus filter 200 is sometimes referred to as an averaging filter. In some embodiments, the constant value is added to the scaled signals directly by combiner 262, thus combiner 260 is omitted. Different types of linear filters may be employed in other embodiments.

The linear filters 202 and 204 shown in FIG. 2A have similar architecture as the one shown in FIG. 2B, although the number of delays and the scaling factors vary for different filters. These linear filters provide other terms in the transfer function, and their absolute values are taken and combined to produce the desired output. In other embodiments, the linear filters may have different designs than what is shown in FIG. 2B.

Figure 3A:
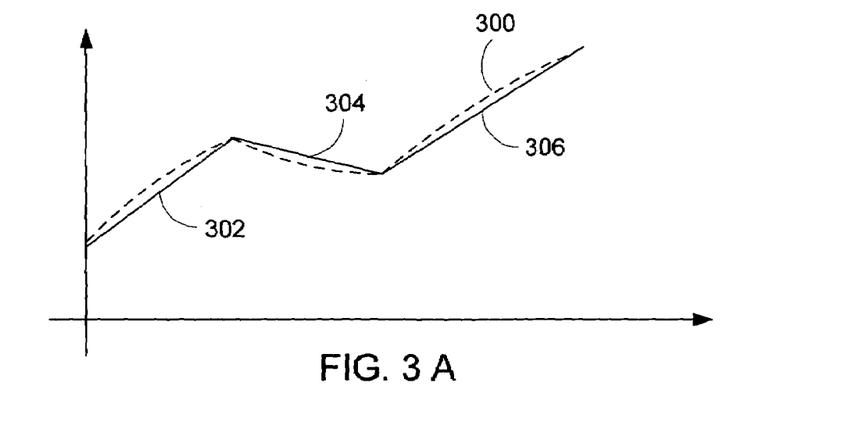
FIGS. 3A-3C are charts illustrating the min-max method used for approximating a higher order nonlinear function, according to one embodiment of the present invention.
Figure 3B:
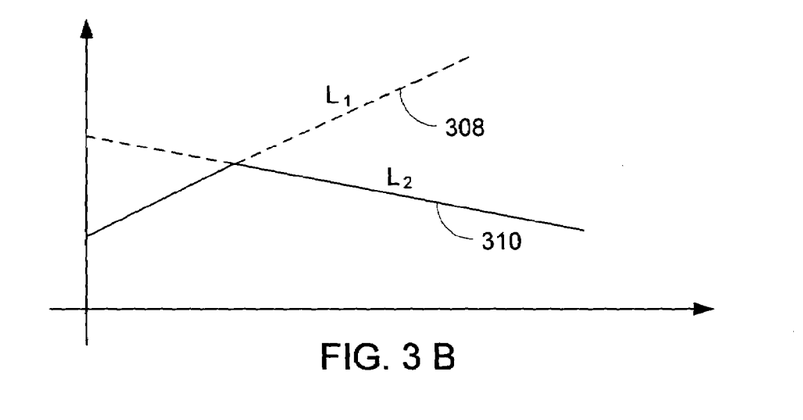
Figure 3C:
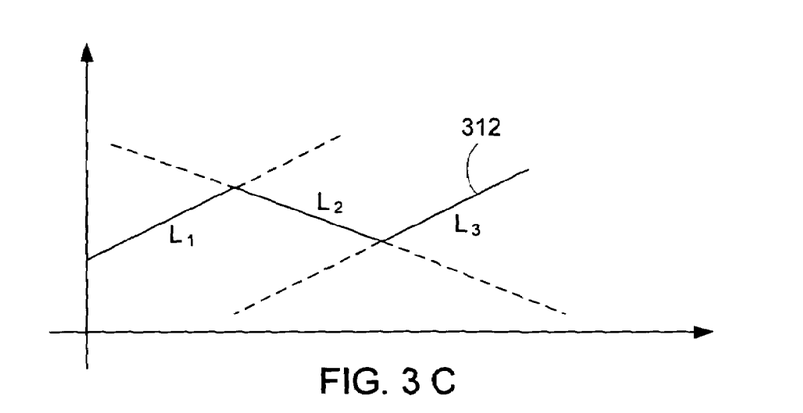

There are other ways to implement a nonlinear filter that has a linearized transfer function approximating another nonlinear function. FIGS. 3A-3C are charts illustrating the min-max method used for approximating a higher order nonlinear function, according to one embodiment of the present invention.

In FIG. 3A, a nonlinear function 300 (shown as a dashed line) is approximated by linear segments 302, 304 and 306. These line segments are obtained using a min-max process shown in FIGS. 3B and 3C.

FIG. 3B illustrates a minimum function applied to two lines 308 and 310. Line 308, referred to as L1, is a line on which segment 302 lies. Line 310, referred to as L2, is a line that includes segment 304. For a given point on the x axis, the minimum function, expressed as min (L1, L2), is used to select the minimum of the corresponding values on L1 and L2. The selected parts of the lines are shown in solid, and the discarded parts are shown in dash.

FIG. 3C illustrates a maximum functions applied to line 312 and min (L1, L2). Line 312, referred to as L3, is a line that includes segment 306. A maximum function, expressed as max (L3, min (L1, L2)), is applied to L3 and the result of the minimum function shown in FIG. 3B. The maximum values are selected. The selected portions are shown in solid whereas the discarded portions are shown in dash. Thus, through a series of min-max operations on a set of lines, segments 302, 304 and 306 are selected.

Mathematically, $\min(L1, L2) = \frac{1}{2}(L1 + L2 - |L1 - L2|)$  (Equation 2)

Similarly, $\max(L1, L2) = \frac{1}{2}(L1 + L2 + |L1 - L2|)$  (Equation 3)

In equations 2 and 3, L1 and L2 represent the transfer functions of two linear filters, $a_1 \cdot x + b_1$ and $a_2 \cdot x + b_2$, respectively. Equations 2 and 3, although comprised of linear parts, are nonlinear due to the absolute value operations. These mathematical expressions are useful for designing filters based on the min-max selection algorithm.

The function max(L3, min (L1, L2)) can also be expressed as max(L3, M1), where M1=min(L1, L2).

According to Equations 2 and 3, the expression can now be expanded to:

$$\frac{1}{2}(L3 + M1 + |L3 - M1|) = \frac{1}{2}\left[L3 + \frac{1}{2}(L1 + L2 - |L1 - L2|) + \left|L3 - \frac{1}{2}(L1 + L2 - |L1 - L2|)\right|\right] \quad \text{(Equation 4)}$$

$$= \frac{L3}{2} + \frac{L1}{4} + \frac{L2}{4} - \frac{1}{2}|L1 - L2| + \frac{1}{2}\left|L3 - \frac{L1}{2} - \frac{L2}{2} + \frac{1}{2}|L1 - L2|\right|$$

Equation 4 is equivalent to Equation 1, and is expressed as a min-max combination of the linear segments and nested absolute values. This alternative form is useful in constructing, manipulating and solve nonlinear filter problems.

Figure 4:
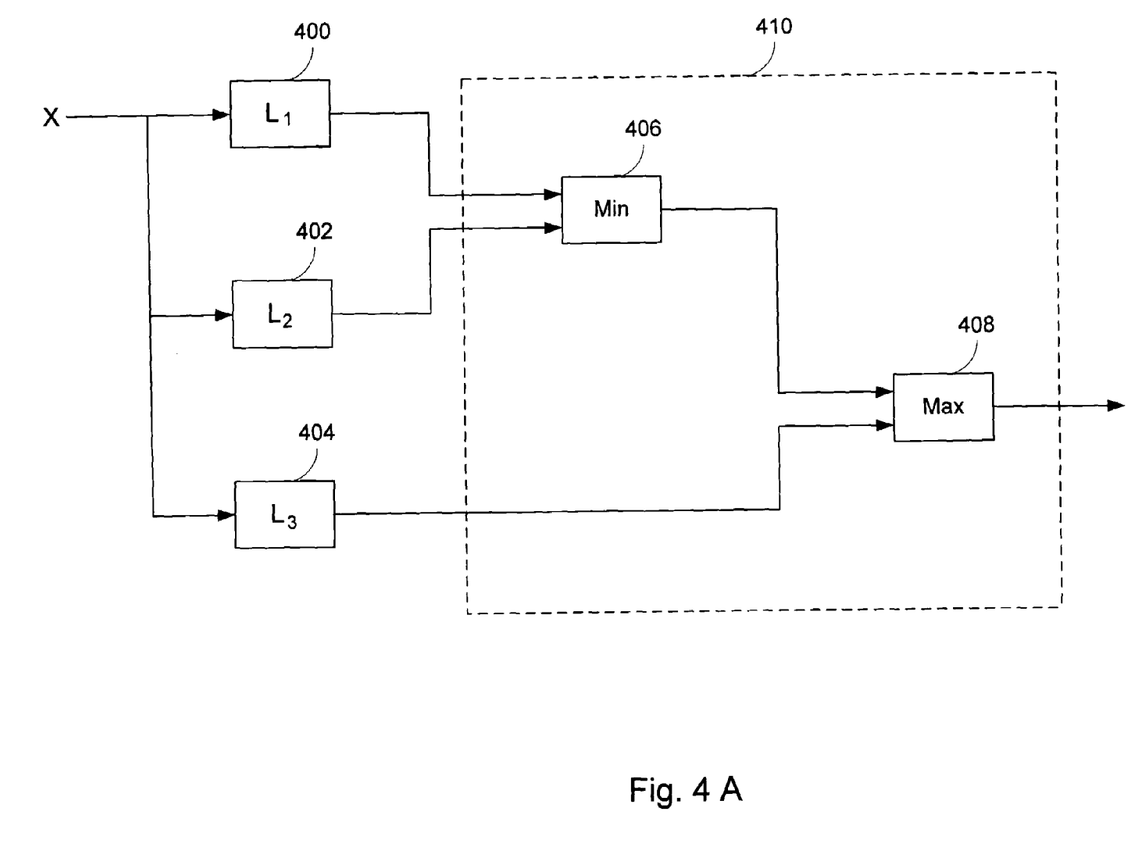
FIGS. 4A-4B are block diagrams illustrating a nonlinear filter embodiment using the min-max algorithm, according to one embodiment of the present invention.

FIGS. 4A-4B are block diagrams illustrating a nonlinear filter embodiment using the min-max algorithm, according to one embodiment of the present invention. FIG. 4A illustrates the overall architecture of the nonlinear filter. The input is sent to linear filters 400, 402 and 404, which have transfer functions characterized by lines L1, L2 and L3, respectively. The filters may be implemented using the architecture shown in FIG. 2B or any other appropriate architecture. The filter outputs are sent to a combination network 410.

In this embodiment, the combination network comprises a min-max selection network used to perform min-max selection operations on the filter outputs. The min-max selection network includes a minimum processor 406 and a maximum processor 408 in a nested configuration, where the output of processor 406 is sent as an input to processor 408. The minimum processor selects the minimum between L1 and L2, producing an output similar to what was shown in FIG. 3B. The maximum processor selects the maximum between L3 and the output from the minimum processor, producing an output similar to what was shown in FIG. 3C. In some embodiments where the transfer function has more segments, the min-max selection network is expanded to include more minimum/maximum processors.

FIG. 4B is a schematic diagram illustrating the details of the nonlinear filter shown in FIG. 4A. Block 450 is the minimum processor and block 470 is the maximum processor. In the minimum processor, the output of linear filters 400 and the output of linear filter 402 are added by a combiner 452, to obtain a signal with a transfer function of L1+L2. The output of filter 402 is also subtracted from the output of filter 400 by combiner 454 to obtain an output with a transfer function that is the difference of the two filter's transfer functions, L1−L2. The difference output is then sent to an absolute value processor 456 to obtain |L1−L2|. Multiplier 460 multiplies |L1−L2| with a negative sign to obtain |L1−L2|, which is then combined by combiner 462 with the sum of L1 and L2. The resulting transfer function is L1+L2−|L1−L2|. For the sake of simplicity, this transfer function is referred to as R from here on.

The minimum processor output is scaled by 12. In the maximum processor, the scaled minimum processor output and the output of linear filter 404 are added by a combiner 472, to obtain a signal with a transfer function that is R+L3. The output of filter 404 is subtracted from the output of the minimum processor by combiner 474 to obtain an output with a transfer function that is the difference, R−L3. The difference is then input to an absolute value processor 476 to obtain |R−L3|. Multiplier 480 multiplies |R−L3| with a positive sign to obtain |R−L3|. Combiner 482 combines the multiplier's output with R+L3 to obtain R+L3+|R−L3|. The output of the maximum processor is then scaled by ½.

The nonlinear filter is sometimes trained to model a system. During the training process, the parameters and configurations of the linear filters included in the nonlinear filter are determined adaptively for the filter to achieve the desired transfer characteristics.

Figure 5:
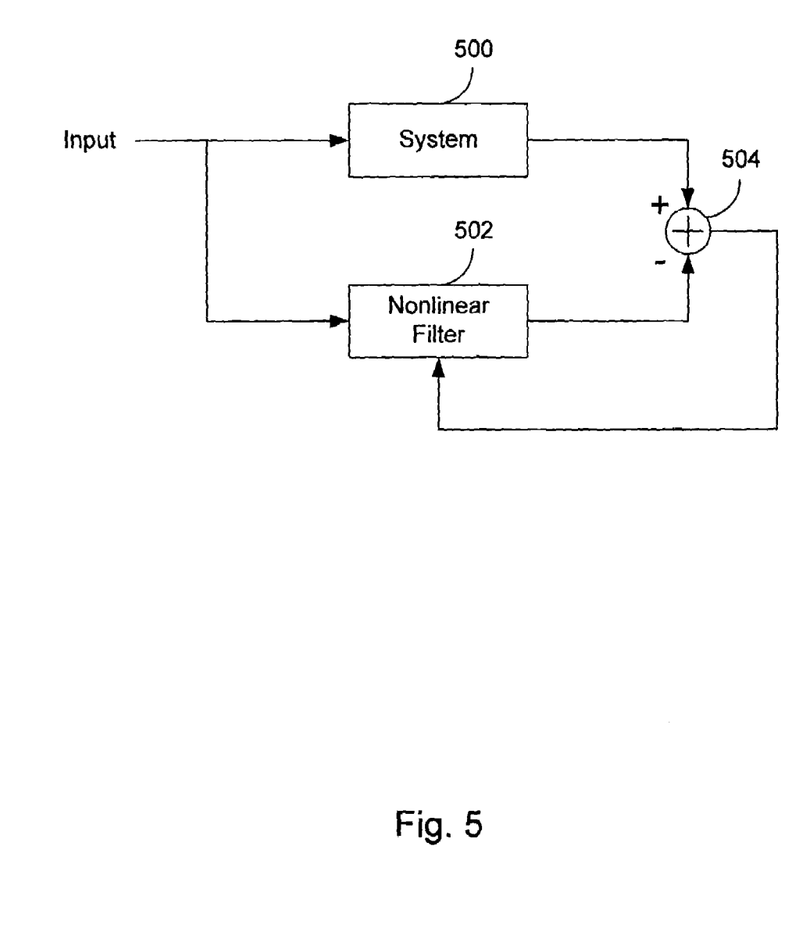
FIG. 5 is a block diagram illustrating a nonlinear filter embodiment that is configured for training.

FIG. 5 is a block diagram illustrating a nonlinear filter embodiment that is configured for training. The training input is sent to both system 500 and a nonlinear filter 502 used to model the system. The difference between the system output and the nonlinear filter output is determined by combiner 504. The difference is propagated back to the nonlinear filter. Based on the difference and the input, the nonlinear filter adapts the parameters and configurations of its linear filters accordingly to minimize the difference. Any appropriate adaptation method (such as the least mean square (LMS) method) may be selected to adapt the parameters and configurations of the linear filters.

In some embodiments, system 500 is an error producing subsystem that introduces errors to the overall system. The filter is designed to model the error producing subsystem and replicate the errors. Thus, the errors can be subtracted from the overall system output and improve the overall system linearity. Using a filter to correct errors is useful for many systems. In one embodiment, an adaptive filter is used in conjunction with an ADC to improve its linearity.

Figure 6:
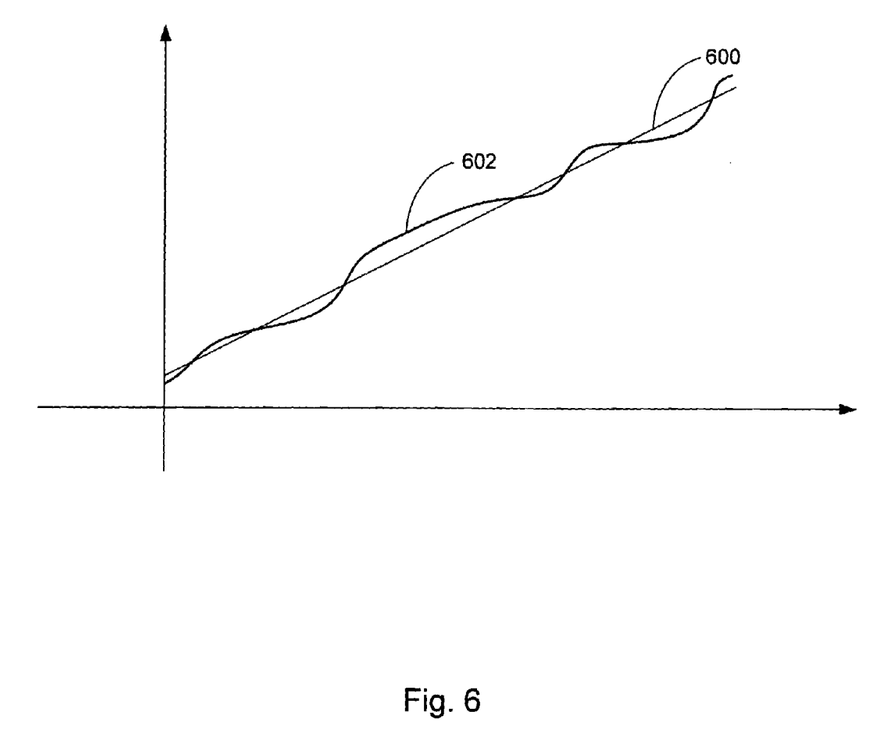
FIG. 6 is a graph illustrating transfer functions of two analog to digital converters (ADC's).

FIG. 6 is a graph illustrating transfer functions of two ADC's. A straight line 600 represents the transfer function for an ideal ADC that is perfectly linear. A wavy line 602 represents the transfer function for an actual ADC, which is nonlinear. There are many causes for the nonlinearity shown in line 602, including quantization errors, component mismatches, and bandwidth limitations of devices. It would be useful to minimize the errors and improve linearity.

Figure 7A:
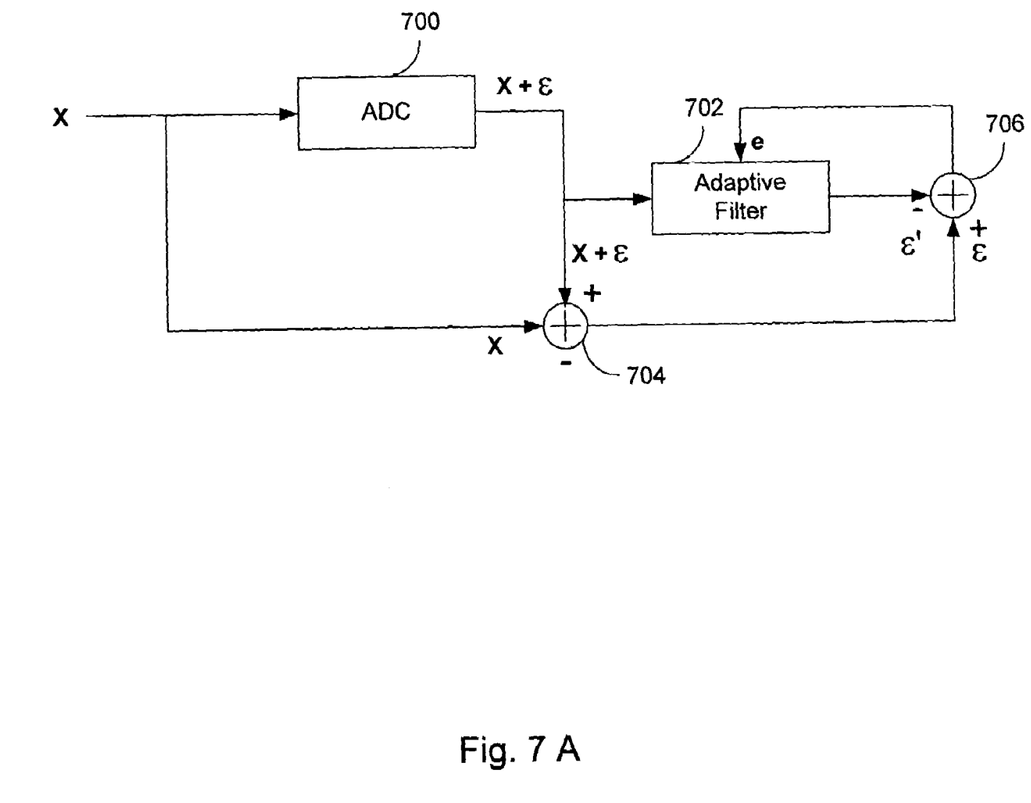
FIGS. 7A-7B are block diagrams illustrating an adaptive ADC embodiment according to the present invention.
Figure 7B:
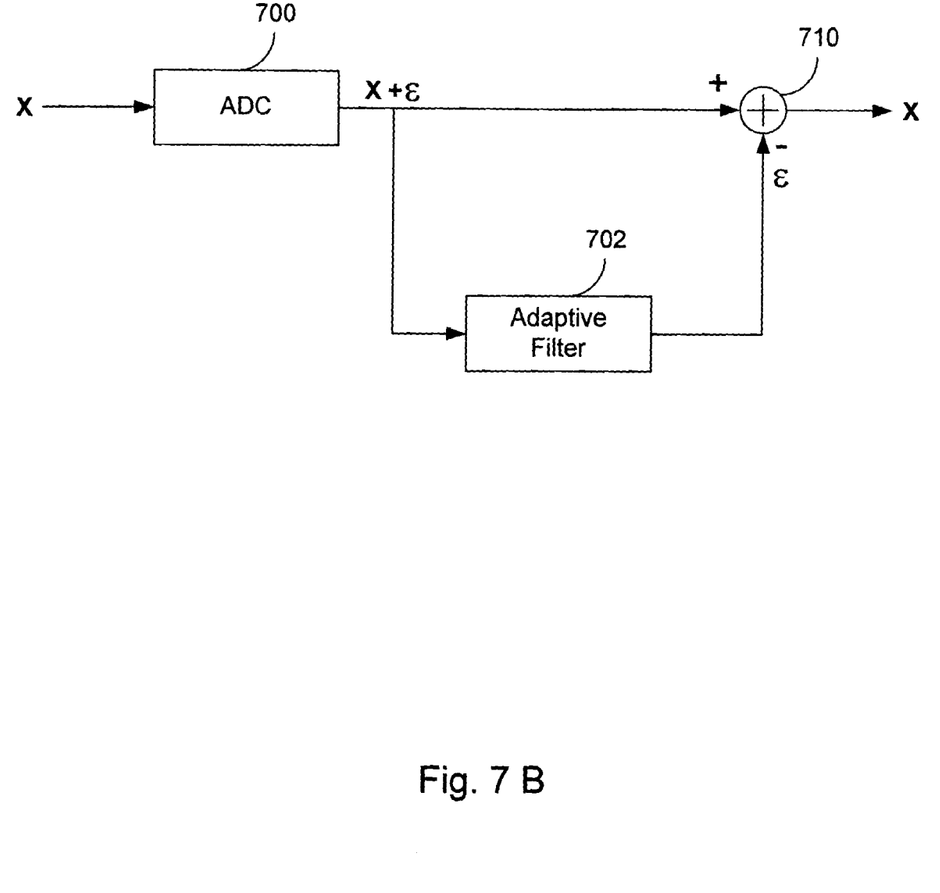

FIGS. 7A-7B are block diagrams illustrating an adaptive ADC system embodiment according to the present invention. The system includes an adaptive filter that is trained to model the way the ADC produces the error. During static state operation, the adaptive filter is used to produce an error signal that is substantially the same as the error produced by ADC. The error is then subtracted from the output of the ADC to reduce the overall error.

FIG. 7A illustrates the adaptive ADC system configuration during the training phase. A known training input, x, is sent to ADC 700. The output of the ADC is expressed as x+ϵ, where ϵ is the error of the ADC output. The difference between x+ϵ and x is computed by combiner 704. x+ϵ is also sent to adaptive filter 702. Based on its input, the filter dynamically adapts its parameters and configurations to produce an output that closely tracks ϵ. The output of the nonlinear filter is denoted as ϵ'. The difference between ϵ and ϵ', denoted as e, is computed by combiner 706. The difference is propagated back to the adaptive filter. The filter further adapts to reduce e, until the output of the nonlinear filter is sufficiently close to the error of the ADC. At this point, the system is ready to enter steady state operation.

FIG. 7B illustrates the steady state operation of the adaptive ADC system. The system is reconfigured to take advantage of the adaptive filter's ability to model the error produced by the ADC. The output of ADC 700, x+ϵ, is sent to adaptive filter 702, which is connected to the ADC in a feedforward configuration. The filter has been trained to produce an output that is approximately ϵ. The ADC output is also sent to combiner 710, which subtracts the output of the adaptive filter from the output of the ADC, generating an output that is approximately x. Thus, the error of the ADC output is greatly reduced.

It should be noted that although the adaptive filter shown in FIGS. 7A-7B may be any filter that is adaptable, it is preferably a nonlinear filter comprised of linear filters.

Figure 8:
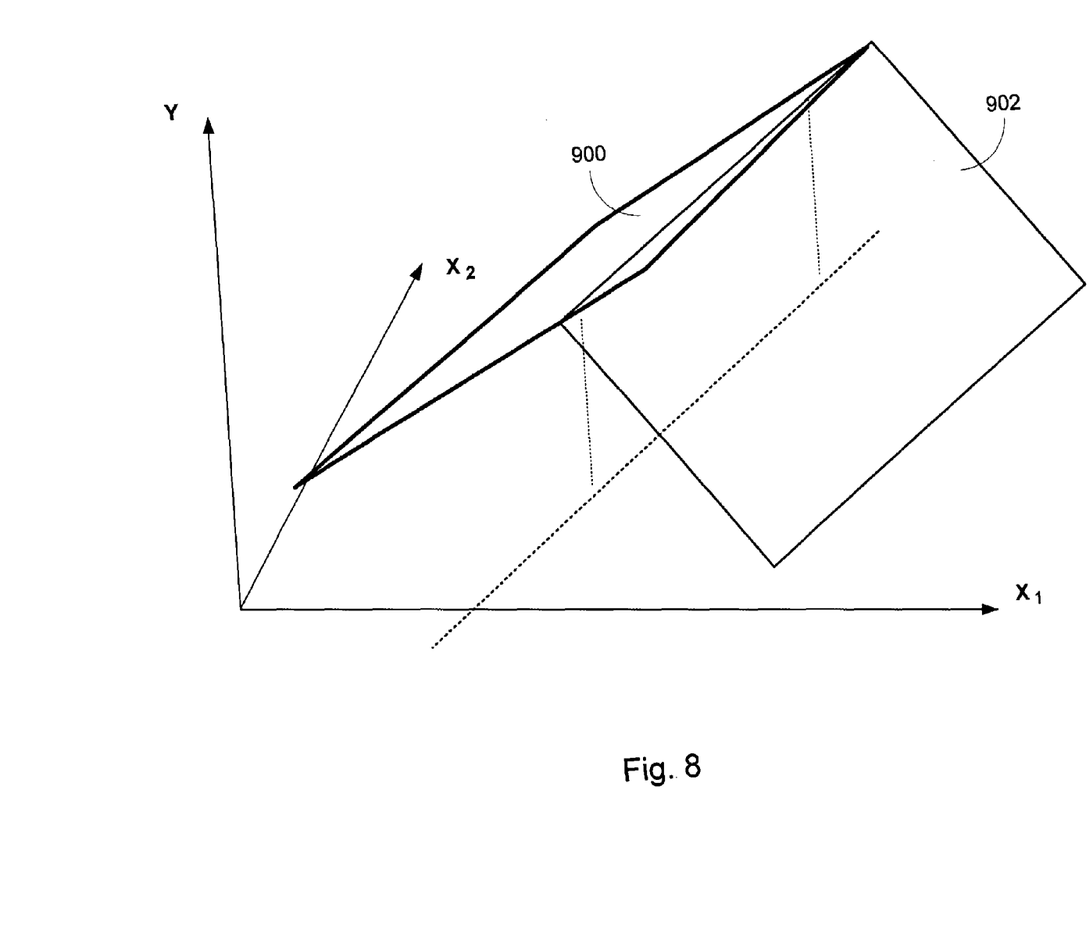
FIG. 8 is a diagram illustrating how a minimum function is applied in a three dimensional system.

The methods and systems pertaining to the present invention can be extrapolated for multidimensional systems. FIG. 8 is a diagram illustrating how a minimum function is applied in a three dimensional system. The system has three axes: x1, x2, and y. The transfer function is bound by a plane 900 (referred to as P1) and a plane 902 (referred to as P2), where $P1=a_{11}x1+a_{21}x2+b_1$ and $P2=a_{12}x1+a_{22}x2+b_2$. For any point on the x1-x2 plane, the minimum function selects the minimum of the corresponding values on P1 and P2. The resulting function, ½ (P1+P2−|P1−P2|), can be implemented using linear filters.

An improved nonlinear filter and its applications have been disclosed. The nonlinear filter includes linear filters connected to nonlinear elements. A combination network is used to combine the outputs of the nonlinear elements. The filter is easier to implement than conventional higher order nonlinear filters. It can be adaptively trained to model nonlinear systems. It is useful in applications that need error reduction and linearity improvement, such as ADC's.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An analog to digital converter system comprising:
   an analog to digital converter (ADC); and
   an adaptive filter coupled to the ADC; wherein:
   the adaptive filter includes a nonlinear filter having a filter characteristic that is adaptable;
   the adaptive filter is coupled to the ADC in a feedforward configuration; and the adaptive filter is trained to reduce an error of an output of the ADC.

2. An analog to digital converter system as recited in claim 1, wherein the adaptive filter is a nonlinear filter.

3. An analog to digital converter system as recited in claim 1, wherein the adaptive filter is trained to reduce the error, including by modeling the error.

4. An analog to digital converter system as recited in claim 1, wherein the adaptive filter is trained to reduce the error, including by adapting a filter parameter.

5. An analog to digital converter system as recited in claim 1, wherein the adaptive filter is configured to output an error signal that is substantially the same as the error.

6. An analog to digital converter system as recited in claim 1, wherein the output of the ADC is sent to the adaptive filter as an input.

7. An analog to digital converter system as recited in claim 1, further comprising a combiner configured to combine an output of the ADC with an output of the adaptive filter.

8. An analog to digital converter system comprising:
   an analog to digital converter (ADC); and
   an adaptive filter coupled to the ADC; wherein
   the adaptive filter is coupled to the ADC in a feedforward configuration;
   wherein the adaptive filter is a nonlinear filter that comprises:
   a plurality of linear filters each having a filter output;
   a plurality of nonlinear elements each connected to one of the plurality of linear filters; and
   a combination network connected to the plurality of nonlinear elements; wherein:
   the nonlinear elements are used to produce nonlinear effects and generate a plurality of nonlinear outputs; and
   the combination network combines the nonlinear outputs.

9. An analog to digital converter system as recited in claim 8, wherein the combination network comprises a min-max selection network.

10. An analog to digital converter system as recited in claim 8, wherein the nonlinear elements are configured to perform absolute value operations to generate a plurality of nonlinear outputs.

11. A method of generating a digital signal based on an analog signal, comprising:
    applying the analog signal to an analog to digital converter (ADC) to generate an ADC output;
    sending the ADC output to an adaptive filter; wherein
    the adaptive filter includes a nonlinear filter having a filter characteristic that is adaptable;
    the adaptive filter is coupled to the ADC in a feedforward configuration; and the adaptive filter is trained to reduce an error of an output of the ADC.

12. A method as recited in claim 11, wherein the adaptive filter is a nonlinear filter.

13. A method as recited in claim 11, wherein further comprising training the adaptive filter to model the error.

14. A method as recited in claim 11, wherein further comprising training the adaptive filter to model the error by adapting a filter parameter.

15. A method as recited in claim 11, wherein the adaptive filter is configured to output an error signal that is substantially the same as the error.

16. A method as recited in claim 11, further comprising sending an output of the ADC to the adaptive filter as an input.

17. A method as recited in claim 11, further comprising combining an output of the ADC with the output of the adaptive filter.

18. A method of generating a digital signal based on an analog signal, comprising:
    applying the analog signal to an analog to digital converter (ADC) to generate an ADC output; and
    sending the ADC output to an adaptive filter; wherein:
    the adaptive filter is coupled to the ADC in a feedforward configuration;
    the adaptive filter is a nonlinear filter that comprises:
    a plurality of linear filters each having a filter output;
    a plurality of nonlinear elements each connected to one of the plurality of linear filters; and
    a combination network connected to the plurality of nonlinear elements; wherein:
    the nonlinear elements are used to produce nonlinear effects and generate a plurality of nonlinear outputs; and
    the combination network combines the nonlinear outputs.

19. A method as recited in claim 18, wherein the combination network comprises a min-max selection network.

20. A method as recited in claim 18, wherein the nonlinear elements are configured to perform absolute value operations to generate a plurality of nonlinear outputs.

* * * * *